United States Patent
Chou et al.

(10) Patent No.: US 6,221,752 B1
(45) Date of Patent: *Apr. 24, 2001

(54) METHOD OF MENDING EROSION OF BONDING PAD

(75) Inventors: Ta-Cheng Chou; Wen-Pin Kuo; Bruce Lai, all of Hsinchu (TW)

(73) Assignee: United Microelectronics Corp., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/186,744

(22) Filed: Nov. 5, 1998

(30) Foreign Application Priority Data

Aug. 20, 1998 (TW) .................................................. 87113701

(51) Int. Cl.⁷ ...................................................... H01L 21/44
(52) U.S. Cl. ............................ 438/612; 438/688; 438/742
(58) Field of Search ...................................... 438/612, 712, 438/742, 702, 688; 257/459, 676, 786

(56) References Cited

U.S. PATENT DOCUMENTS

| | | | | |
|---|---|---|---|---|
| 4,442,966 | * | 4/1984 | Jourdain et al. | 228/123 |
| 5,300,461 | * | 4/1994 | Ting | 437/227 |
| 5,380,401 | * | 1/1995 | Jones et al. | 156/665 |
| 5,384,284 | * | 1/1995 | Doan et al. | 437/190 |
| 5,451,291 | * | 9/1995 | Park et al. | 438/702 |
| 5,519,254 | * | 5/1996 | Tabara | 257/751 |
| 5,747,868 | * | 5/1998 | Reddy et al. | 257/529 |
| 5,770,100 | * | 6/1998 | Fukuyama et al. | 216/69 |
| 5,882,489 | * | 3/1999 | Bersin et al. | 204/192.35 |

FOREIGN PATENT DOCUMENTS

1525148 * 12/1976 (GB) ............................ H01L/23/00

OTHER PUBLICATIONS

S. Wolf, (Silicon Processing for the VLSI Era, vol. 2: Process Integration, Lattice Press: Sunset Beach, CA; pp. 214–217, 1990.*

* cited by examiner

Primary Examiner—Charles Bowers
Assistant Examiner—Erik J Kielin
(74) Attorney, Agent, or Firm—Jiawei Huang; J C Patents

(57) ABSTRACT

A method mending the erosion of bonding pad. A passivation layer and a polyimide layer are sequentially formed on a wafer to cover a bonding pad, where the polyimide layer is patterned to expose a portion of the passivation layer. The polyimide layer is used as a mask for etching the passivation layer, so as to expose the bonding pad. The bonding pad is eroded by the etchant residue remaining after etching the passivation layer on the bonding pad. After removing the eroded part of the bonding pad, an oxide layer is formed subsequently to prevent a further erosion.

10 Claims, 4 Drawing Sheets

METHOD OF MENDING EROSION OF BONDING PAD

CROSS-REFERENCE TO RELATED APPLICATION

This application claims priority benefit of Taiwan application Serial no. 87113701, filed Aug. 20, 1998, the full disclosure of which is incorporated herein by reference.

BACKGROUND OF THE INVENTION

1. Field of the Invention

The invention relates in general to a fabricating process of an integrated circuit, and more particularly, to a method of mending the erosion of a bonding pad caused by a residue on the bonding pad.

2. Description of the Related Art

When the main structure of an integrated circuit is formed, a protection layer is formed on the surface of the integrated circuit to protect the underlying devices or components of the integrated circuit. An ideal protection layer is formed with characteristics of uniform deposition, anti-cracking property, nonexistence of voids, resistance of penetration of moisture and alkaline ions, hardness, and strength of sustaining mechanical damage.

Silicon nitride and phospho-silicate glass (PSG) are commonly used for forming the protection layer. Silicon nitride which has a density higher than PSG is superior to resist the penetration of moisture and alkaline ions and to protect the integrated circuit from being damaged by an external mechanism. On the other hand, PSG contains phosphorous which has the gettering property, so that the moisture and alkaline ions can also be absorbed effectively to prolong the lifetime of the integrated circuit. Typically, a polyimide layer is formed after the formation of a silicon nitride layer for waterproofing.

The polyimide layer can be formed by a method of using one photo-mask or two photo-masks. The method of using one photo-mask is more straightforward and less time consuming than the method of using two photo-masks.

Aluminum is one of the most popular conductive materials applied in very large-scale integration (VLSI) currently. The aluminum has a good conductivity and adhesion, moreover, the cost of aluminum is low, and it is easily deposited and etched. Therefore, the bonding pad of an integrated circuit is often formed by aluminum.

In a conventional method, after the formation of a bonding pad on a substrate, a PSG layer is formed to cover the bonding pad and the substrate, and a silicon layer thicker than the PSG layer is formed on the PSG layer. For the purpose of protection, a polyimide layer is further formed on the silicon nitride layer. The polyimide layer can also function as a photo-resist layer for a photolithography process to define an opening penetrating through the silicon nitride layer and the PSG layer to expose the bonding pad. Since the polyimide can be removed in organic solution, after the etching process, a thorough cleaning process can not be performed by organic solution properly.

During the process of etching the silicon nitride layer and the PSG layer, an etchant containing fluorine is typically used. However, the fluorine cannot be properly cleaned away leaving residue on the surface of the bonding pad. With the residue of fluorine, the surface of the bonding pad is easily eroded affecting the profile and yield in the subsequent bonding process. Moreover, wafers being eroded sometimes fail the required quality and must be abandoned, causing waste.

SUMMARY OF THE INVENTION

It is an object of the invention to provide a method of mending the erosion of the bonding pad. The method reduces the waste of abandoning the wafers with eroded bonding pads. Therefore, the yield of the product is improved.

It is another object of the invention to provide a method of mending the erosion on a bonding pad on a wafer. While a bonding pad having a surface being eroded by halide from the etching process, the halide is removed from the surface of the bonding pad. The eroded bonding is stripped to expose the bonding pad which has not been eroded. A protection layer is formed on the exposed bonding pad.

In a preferred embodiment of the invention, a polyimide layer is formed as a photo-resist layer to define a passivation layer covering the bonding pad and the wafer. Being defined by etching process with etchant containing halide, a halide residue is left on a surface of the bonding which erodes the bonding pad. In the invention, the halide is removed from the surface followed by stripping the erosion part of the bonding bad. A protection layer is then formed to cover the bonding pad. It is often that when the bonding pad fails the quality inspection after being eroded, the whole wafer has to be abandoned. In addition, even the bonding pads with erosion pass the inspection, the profile thereof is deformed and the yield of the subsequent bonding process is seriously affected. As a result, the invention provides a method of mending the eroded bonding pad to minimize the waste of abandoned wafers, and to enhance the yield of fabrication process.

Both the foregoing general description and the following detailed description are exemplary and explanatory only and are not restrictive of the invention, as claimed.

DESCRIPTION OF THE PREFERRED EMBODIMENTS

Figure 1A:
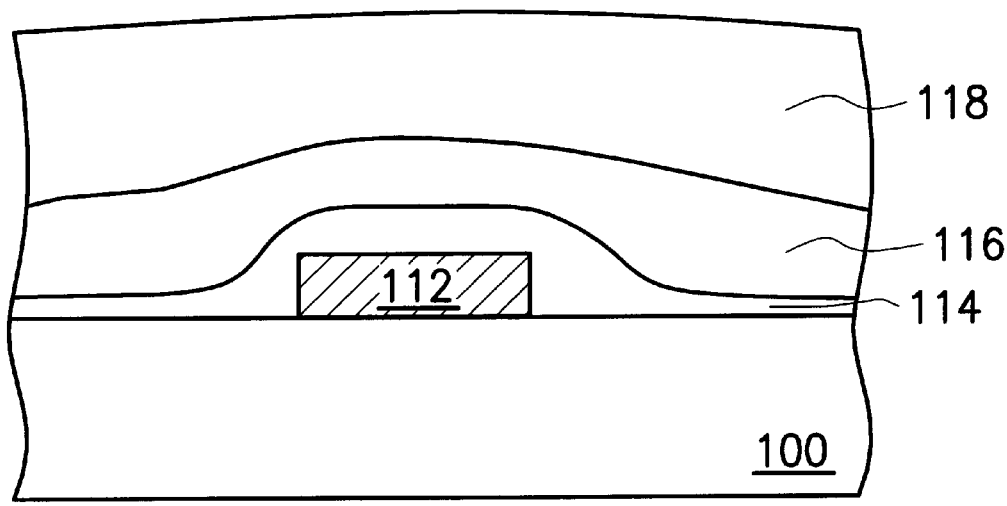
FIG. 1A to FIG. 1E shows a method of removing the residue on a bonding pad in a preferred embodiment according to the invention.

In FIG. 1A, a wafer 100 having an integrated circuit which comprises devices such as metal-oxide semiconductor (MOS) or other components (not shown) formed therein is provided. A bonding pad 112, for example, a layer of aluminum, aluminum alloy, or other conductive material, is formed on the substrate wafer 100. A phospho-silicate glass layer 114 is formed, for example, by chemical vapor deposition (CVD) such as atmospheric pressure CVD, on the bonding pad 112 and the wafer 100 to serve as a layer or a gettering layer to isolate the underlying integrated circuit from moisture and alkaline ions by absorption. A silicon nitride layer 116 is formed on the PSG layer 114. The silicon nitride layer 116 is thicker than the PSG layer 114 to block the moisture and alkaline ions, and to protect the underlying integrated circuit from being damaged by external mechanical force. The PSG layer 114 and the silicon layer 116 are formed as a passivation layer for the bonding pad. A polyimide layer 118 is formed on the silicon nitride layer 116. The polyimide layer 118 is functions as a protection layer to further prevent the penetration of moisture.

Figure 1B:
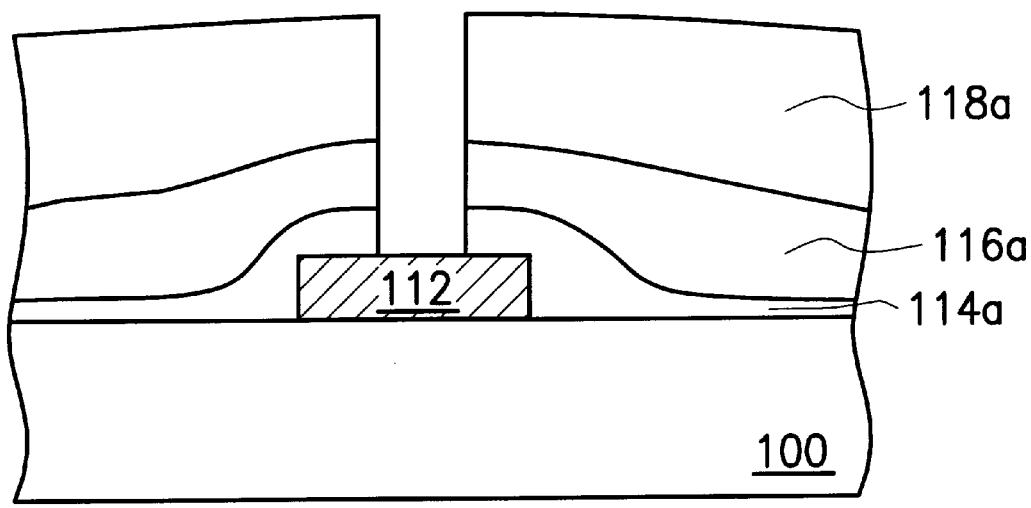
Figure 1C:
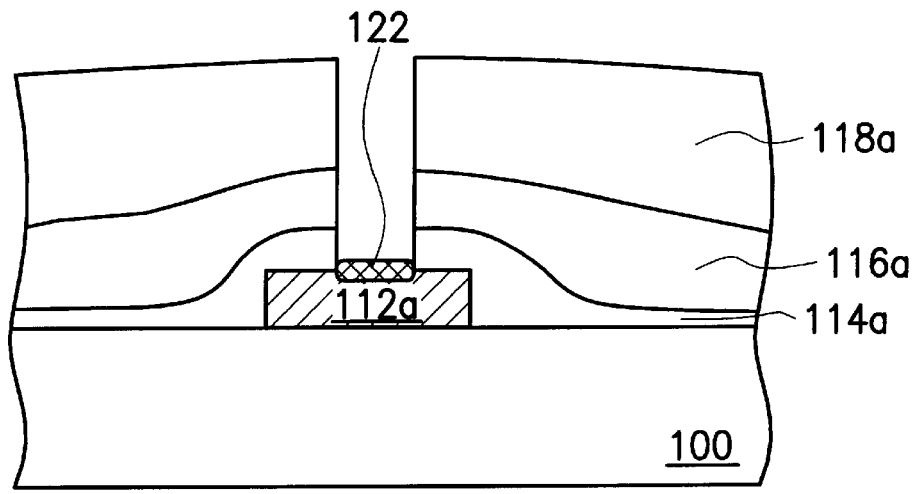

In FIG. 1B, using a photo-mask, the polyimide layer 118 is defined to form an opening which exposes a part of the silicon nitride layer 116 aligned over the bonding pad 112. The polyimide layer 118a can function as a photo-resist layer. Using the defined polyimide layer 118 as a mask, the passivation layer, that is, the silicon nitride layer 116 and the PSG layer 114 are etched to expose the bonding pad 112. Typically, an etchant containing halide such as fluorine is used, therefore, after the etching process, a halide-contained residue is subsequently formed on the bonding pad 112. Since polyimide can be resolved in organic solution, after the etching process, a thorough cleaning process can not be performed by organic solution properly. After being exposed, the bonding pad 112 has a surface with halide residue, for example, fluoride residue, left thereon. The halide residue seriously affects the profile of the bonding pad 112. In FIG. 1C, the halide residue erodes a part of the bonding pad 112 to form a metal erosion part 122 such as a metal halide, for example, aluminum fluoride ($AlF_3$), and oxide which greatly degrade the yield of the subsequent bonding process. It is often that the wafer 100 having a bonding pad 112 being eroded is abandoned.

Figure 1D:
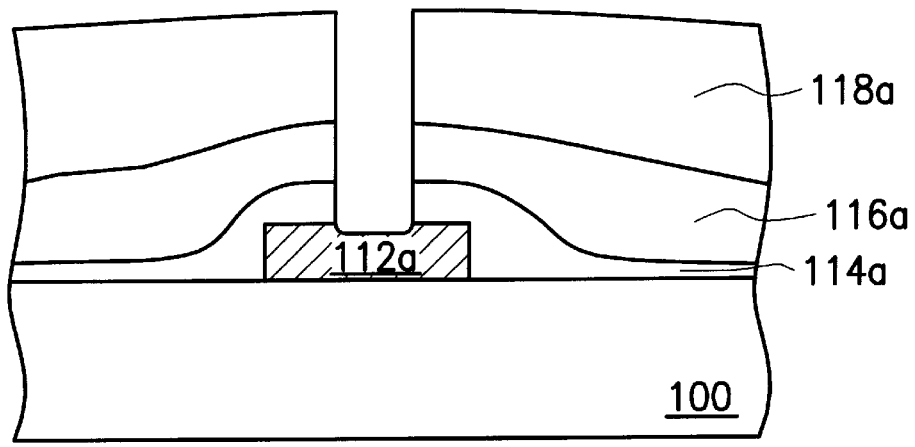
Figure 1E:
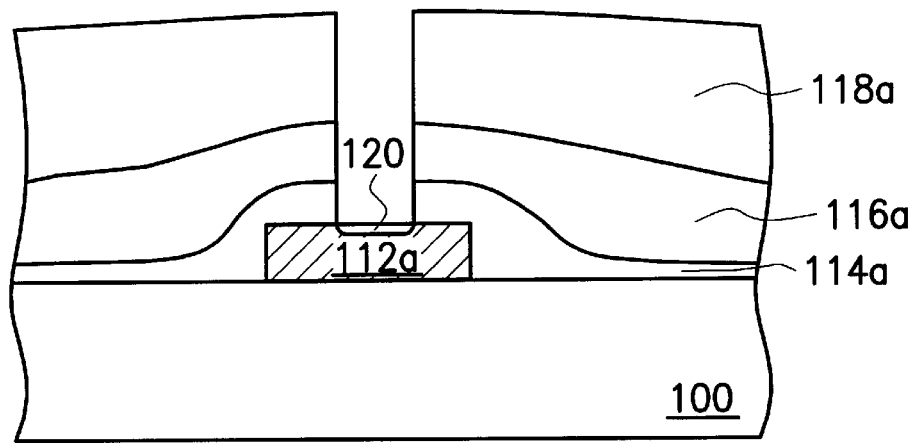

In FIG. 1D, the residue is removed from the surface on the bonding pad 112. The metal erosion part 122 is stripped to expose a clean surface of the bonding pad 112a. The thickness of the bonding pad 112 is typically sufficiently thick that after being stripped a metal erosion part 122 thereof, the device quality is substantially unaffected. Using steam plasma, a thin oxide layer 120 is formed on the clean surface of the bonding pad 112a, as shown in FIG. 1E. The oxide layer 120 is formed as a protection layer to avoided further damage such as erosion to the bonding pad 112a. The thin oxide layer 120 preferably is a thin layer just filling the metal erosion part 122 of the bonding pad 112a. The thin oxide layer 120 generally does not affect bonding quality when a subsequent bonding process is performed. The thin oxide layer 120 can protect the bonding pad 112a from damage before the bonding process is actually performed later.

Figure 2A:
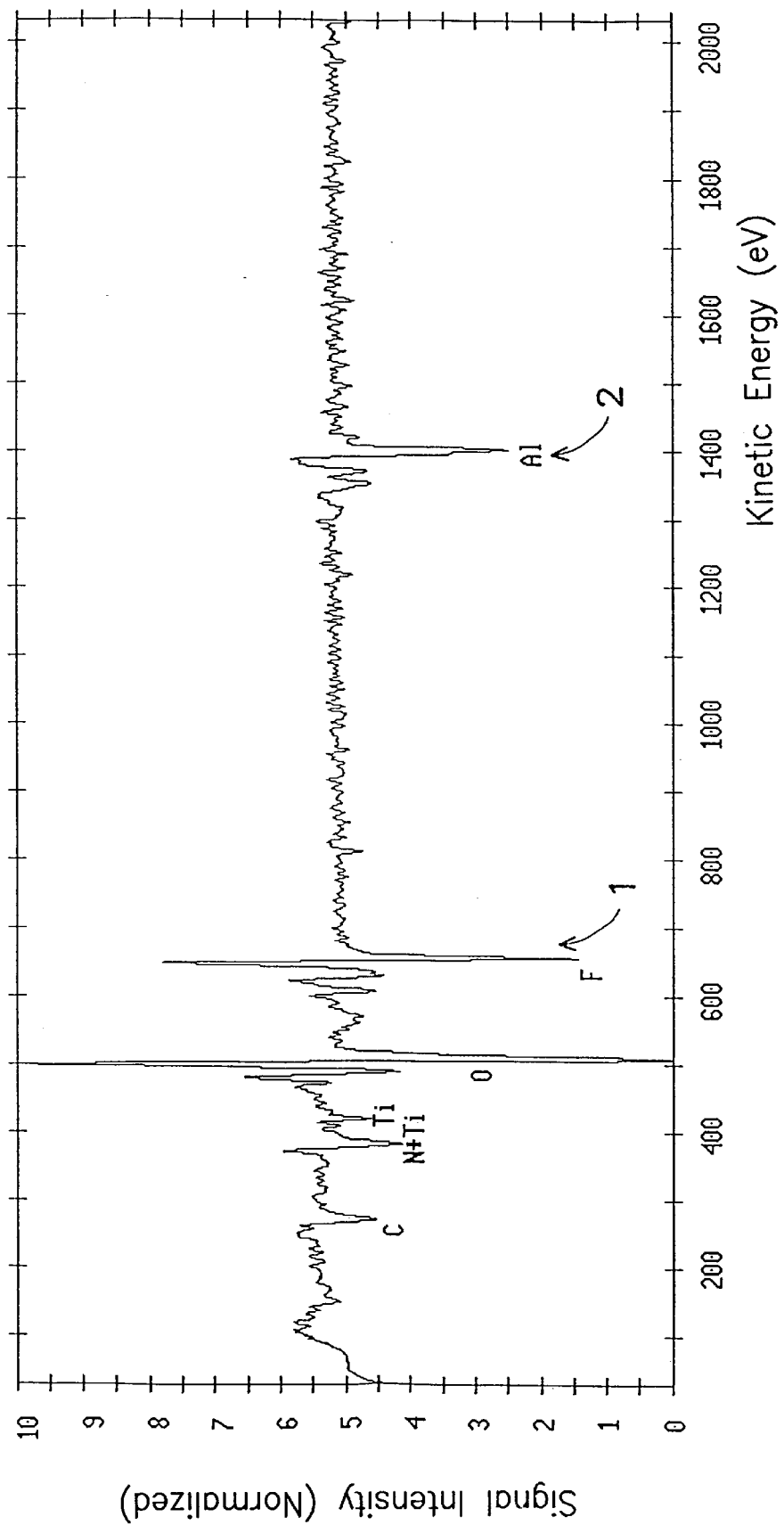
FIG. 2A shows an Auger spectrum of a bonding pad before being eroded.
Figure 2B:
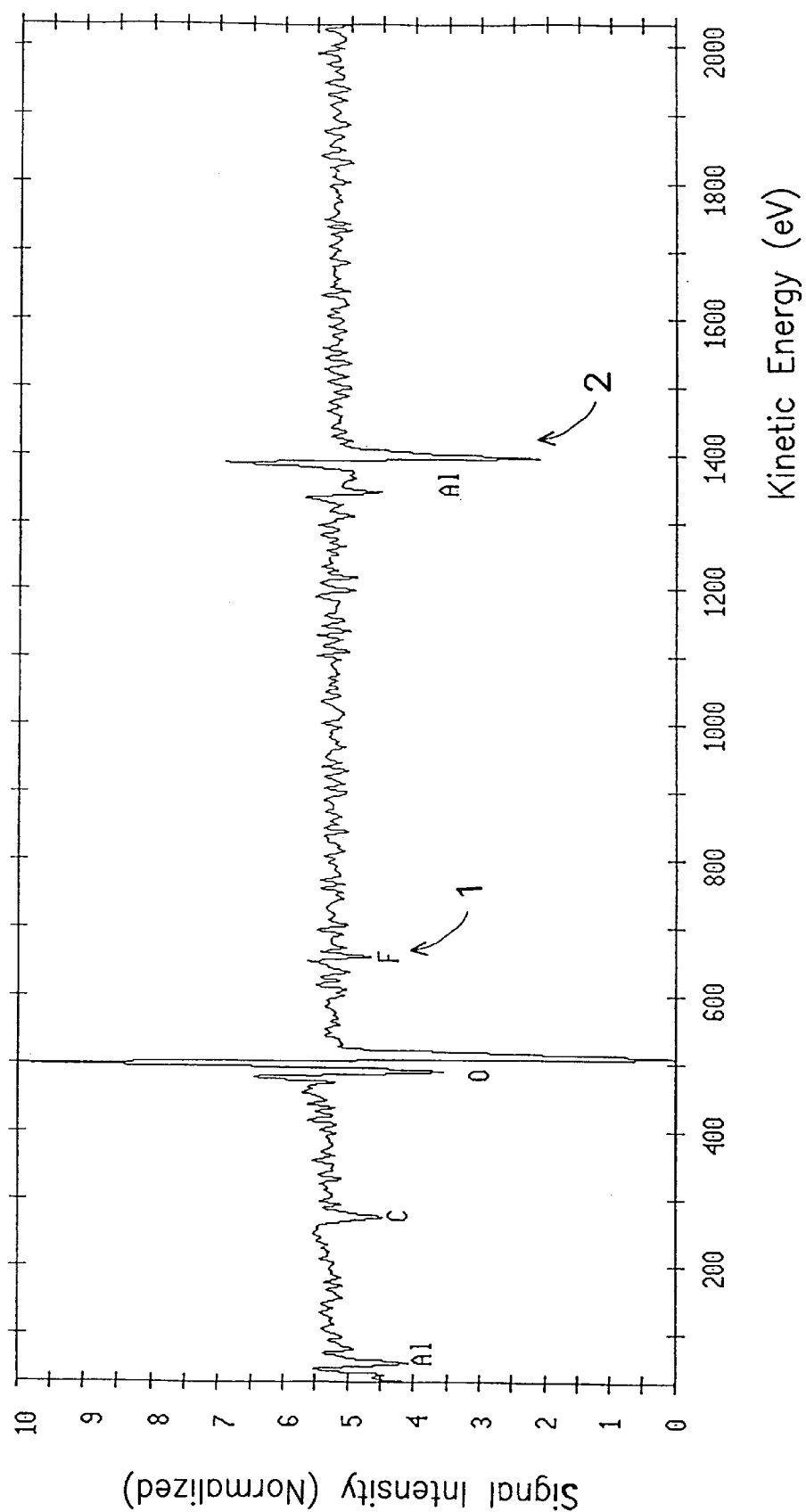
FIG. 2B shows an Auger spectrum of a bonding pad being eroded followed by mending.

FIG. 2A shows an Auger spectrum of a bonding pad before being eroded. In the figure, Peak 1 represents with signal of fluorine left on the bonding pad, while Peak 2 represents a signal of the aluminum of the bonding pad. By comparing the ratio of the signal intensity of Peak 1 to the signal intensity of Peak 2, it is found that the fluorine residue on the bonding pad, as shown in FIG. 2B, can be removed effectively and therefore, can enhance the yield of the subsequent bonding process.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of mending a bonding pad being eroded on a wafer, comprising:

forming a passivation layer on the bonding pad and the wafer;

forming a polyimide layer on the passivation layer;

defining the polyimide layer to expose a part of the passivation layer aligned over the bonding pad;

etching the passivation layer to expose a surface of the bonding pad, using the polyimide layer as a mask, wherein a residue remains on the surface of the bonding pad, in which the residue erodes a surface portion of the bonding pad and forms a metal erosion layer thereon;

removing the residue from the surface of the bonding pad;

stripping the metal erosion layer of the bonding pad by using a plasma to expose a clean surface of the bonding; and forming a protection layer on the clean surface of the bonding pad by using a steam plasma, wherein a thickness of the protection layer is sufficiently thin without affecting subsequent bonding process.

2. The method according to claim 1, wherein the wafer comprises an integrated circuit formed therein.

3. The method according to claim 1, wherein the passivation layer comprises a phospho-silicate glass layer and a silicon nitride layer.

4. The method according to claim 1, wherein the passivation layer is etched with an etchant containing fluorine.

5. The method according to claim 1, wherein the bonding pad includes an aluminum layer.

6. The method according to claim 1, wherein the bonding pad includes an aluminum alloy layer.

7. The method according to claim 1, wherein the residue includes aluminum fluoride.

8. The method according to claim 1, wherein the protection layer includes a thin oxide layer.

9. A method of mending a metal erosion due to a halide residue on a bonding pad on a wafer, comprising:

removing the halide residue;

stripping the metal erosion to expose a clean surface of the bonding pad by using a plasma, wherein a recessing region is formed on the bonding pad; and forming a protection layer to cover the clean surface of the bonding pad by using a steam plasma, wherein a thickness of the protection layer is sufficiently thin without affecting subsequent bonding process.

10. The method according to claim 9, wherein the protective layer comprises a thin oxide layer.

* * * * *